United States Patent [19]
Taniguchi et al.

[11] Patent Number: 5,603,763
[45] Date of Patent: Feb. 18, 1997

[54] METHOD FOR GROWING SINGLE CRYSTAL

[75] Inventors: Yoshiteru Taniguchi; Toshiaki Asahi, both of Toda, Japan

[73] Assignee: Japan Energy Corporation, Tokyo, Japan

[21] Appl. No.: 535,098
[22] PCT Filed: Dec. 14, 1994
[86] PCT No.: PCT/JP94/02089
 § 371 Date: Oct. 18, 1995
 § 102(e) Date: Oct. 18, 1995
[87] PCT Pub. No.: WO95/22643
 PCT Pub. Date: Aug. 24, 1995

[30] Foreign Application Priority Data

Feb. 21, 1994 [JP] Japan .................................. 6-022659
Jul. 13, 1994 [JP] Japan .................................. 6-161539

[51] Int. Cl.⁶ ....................................................... C30B 7/10
[52] U.S. Cl. ........................................ 117/83; 117/2; 117/81
[58] Field of Search ................................ 117/2, 24, 81, 117/83, 82, 100

[56] References Cited

U.S. PATENT DOCUMENTS

| | | | |
|---|---|---|---|
| 3,853,487 | 12/1974 | Mueleman et al. | 117/83 |
| 4,190,486 | 2/1980 | Kyle | 117/81 |
| 5,037,621 | 8/1991 | Kennedy et al. | 117/83 |
| 5,169,486 | 12/1992 | Youet et al. | 117/83 |
| 5,471,938 | 12/1995 | Uehida et al. | 117/81 |

FOREIGN PATENT DOCUMENTS

| | | | |
|---|---|---|---|
| 53-5867 | 3/1978 | Japan . | |
| 64-37488 | 2/1989 | Japan . | |
| 1-212291 | 8/1989 | Japan . | |
| 1-246199 | 10/1989 | Japan . | |
| 2-167882 | 6/1990 | Japan . | |
| 2-239181 | 9/1990 | Japan . | |
| 3040987 | 2/1991 | Japan | 117/83 |
| 3-183682 | 8/1991 | Japan . | |
| 5-70276 | 3/1993 | Japan . | |
| 5-59873 | 9/1993 | Japan . | |

*Primary Examiner*—R. Bruce Breneman
*Assistant Examiner*—FeLisa Garrett
*Attorney, Agent, or Firm*—Birch, Stewart, Kolasch & Birch, LLP

[57] ABSTRACT

A single crystal growing method for producing a high-quality and large-diameter single crystal of a compound semiconductor with a good yield, is disclosed.

A volatile element 2 is first put into a reservoir portion 1A of a quartz ampule 1. Further, a crucible 4 made of pBN, which contains a raw material 3A of a compound semiconductor, is placed in the quartz ampule 1, the vacuum sealing of which is then performed. While a vapor pressure controlling operation is performed, a furnace temperature distribution is controlled in such a manner that a vertical first temperature gradient $\alpha$ ° C./cm in the vicinity of an outside wall of the quartz ampule corresponding to a raw melt 3B is smaller than a vertical second temperature gradient ($\beta$ ° C./cm) in a range above the top end of the crucible 4 and simultaneously, the temperature is gradually lowered. Furthermore, $\alpha$ ranges from $51/D^2$ to $102/D^2$ ° C./cm, and preferably ranges from $58/D^2$ to $83/D^2$ ° C./cm (incidentally, the diameter of the single crystal is D cm). Additionally, $\beta$ ranges from 1.06× to 1.72×° C./cm, more preferably, ranges from 1.19X to 1.46X ° C./cm ( incidentally, X is given by the following equation: $X = \sqrt{R\rho/\lambda n L}$, where the cooling rate of the furnace temperature and the coefficients of thermal conductivity, the specific gravity, the latent heat of melting and the formula weight of the crystal are assumed to be R ° C./hr, $\lambda$ kcal/cm·hr·K, $\rho$g/cm³, L kcal/mol and n g/mol, respectively).

6 Claims, 4 Drawing Sheets

METHOD FOR GROWING SINGLE CRYSTAL

TECHNICAL FIELD

The present invention generally relates to a method for growing a single crystal of a compound semiconductor and more particularly to a method for performing the melt growth of a single crystals of CdZnTe or CdTe in accordance with a vertical gradient freezing (VGF) method while performing a vapor pressure control operation.

BACKGROUND ART

Hitherto, there have been known a vertical gradient freezing (VGF) method and a vertical Bridgman method as methods for growing single crystals of compound semiconductors. Further, there have been filed applications concerning methods for controlling various growth requirements for growing good-quality single crystals which have few dislocations or the like.

For example, regarding VGF method, there has been well-known the invention described in the Japanese Patent Application Publication (Examined) No. Tokuko-Hei 5-59873. The gist of this invention is as follows. That is, a single crystal is grown downwardly from the center of the surface of a raw melt by cooling the inside of a heating furnace at a solid-liquid interface temperature gradient of 0.1 to 10° C./cm and at a cooling rate of 0.1 to 1° C./hr while the distribution of temperature in the heating furnace is maintained in such a manner that the center of the surface of the raw melt is at the lowest temperature and that as a temperature measuring position therein becomes radially outwardly and downwardly farther away therefrom, the temperature increases.

Further, regarding Bridgman method, there have been filed applications concerning a method for regulating a furnace wall temperature gradient along the crystal and a furnace wall temperature gradient along the melt on the basis of the coefficients of thermal conductivity of the crystal and the melt, respectively (as described in the Japanese Patent Application Publication (Laid-Open) No. Tokukai-Hei 2-239181 and a method for detecting temperatures at a plurality of points on the outer circumference of a crucible and for calculating and estimating the temperature distribution in the crucible and the position and shape of the growth boundary face at regular time intervals according to the detected temperatures, thereby controlling the growth requirements (as described in the Japanese Patent Application Publication (Laid-Open) No. Tokukai-Hei 1-212291).

Moreover, there have been well-known methods of the inventions disclosed in the Japanese Patent Application Publication (Laid-Open) Nos. Tokukai-Hei 2-167882 and 3-183682 other than the previously filed aforementioned applications as a method for growing a crystal by establishing a vertical temperature gradient by use of a vertical type heating furnace similarly as in the cases of VGF method and Bridgman method. In the case of the invention described in the Japanese Patent Application Publication (Laid-Open) No. Tokukai-Hei 2-167882, a vertical type vessel, on the top of which a nearly inverse-conical portion having a small top opening is provided, is used. Further, the vessel is filled with a raw melt. Moreover, a seed crystal is made to be in contact with the raw melt through the small top opening. Thereby, the solidification of the raw melt is performed downwardly. The invention described in the Japanese Patent Application Publication (Laid-Open) No. Tokukai-Hei 3-183682 is an improvement of the invention described in the Japanese Patent Application Publication (Laid-Open) No. Tokukai-Hei 2-167882. In the case of the invention described in the Japanese Patent Application Publication (Laid-Open) No. Tokukai-Hei 3-183682, a small bottom opening for making excessive melt flow out therefrom is provided in the lower portion of a vertical vessel similar to that used in the method of the invention described in the Japanese Patent Application Publication (Laid-Open) No. Tokukai-Hei 2-167882. Thus, the failure or the like of the vessel due to the expansion of the volume thereof associated with the solidification of the melt can be prevented by making the raw melt flow out from the small bottom opening.

Furthermore, regarding a method of using a lateral type heating furnace like a horizontal Bridgman method and a horizontal gradient freezing method, there has been well-known a method of the invention described in the Japanese Patent Application Publication (Examined) No. Tokuko-Sho 53-5867. In the case of this method, a container containing a melt and a seed (i.e., a seed crystal) is charged into the lateral type furnace. Further, the solidification of the melt is started from the free surface (i.e., the top surface) thereof and is finished on the bottom surface thereof by keeping the temperature on the surface of the melt, which is in contact with the bottom of the container, higher the temperature on the top surface of the melt.

However, although a single crystal, the quality of which is higher than as obtained by the vertical Bridgman method, can be obtained in accordance with the control method described in the Japanese Patent Application Publication (Examined) No. Tokuko-Hei 5-59873, all of the grown crystals (ingots) are not always single crystals. Some of the grown crystals are poly-crystallized. Thus, this method has a problem in that the yield is not so high.

Additionally, in recent years, a good-quality and large-diameter single crystal, which has few crystal defects such as dislocations and is, for instance, 4 inches in diameter, is desired. However, a method, by which such a single crystal is produced with a good yield, has not been established yet.

The present invention has been accomplished in view of such circumstances. An object of the present invention is to provide a method for growing a single crystal, by which good-quality and large-diameter single crystals can be produced with a good yield.

DISCLOSURE OF THE INVENTION

In order to achieve the foregoing object, the inventor of the present invention and so on first put a material of CdZnTe into a pBN crucible (that is, a crucible made of pyrolytic boron nitride). Then, the vacuum sealing of such a crucible in a quartz ampule. Subsequently, a 3-inch-diameter crystal of CdZnTe is grown according to VGF method. Further, the number of 25 mm×30 mm rectangular substrates obtained from such a single crystal, which are compliant with product standards, is evaluated as an average value per growth (that is, the yield of single crystal substrates).

As a result, in contrast with the fact that the yield of the single crystal substrates is 4.6 to 4.8 sheets in the case of using a two-stage type heating furnace 10 having two-stage heaters 11 and 12 as illustrated in FIG. 1(a) without controlling a vapor pressure (incidentally, a quartz ampule is filled with the simple substance of Cd of an amount corresponding to the content volume of the quartz ampule together with the raw material, the yield is increased to 10.9 sheets in the case of using a quartz ampule with a reservoir portion and also using a three-stage type heating furnace 20 having three-stages of heaters 21, 22 and 23 as illustrated in FIG. 1(*b*) while the vapor pressure is controlled in such a manner as to uniformly heat and hold the reservoir portion containing the simple substance of Cd.

The inventor of the present invention and so on took note of the phenomenon that some of the three-stage heating furnaces, which are used by controlling the vapor pressure in such a manner, provide good yields of the single crystal substrates but other three-stage heating furnaces provide poor yields thereof. Further, the inventor of the present invention and so forth conducted investigations to determine the cause of the phenomenon. As a result, it was found that the furnaces providing the good yields were different in the furnace temperature-distribution characteristics from those providing the poor yields. Further, the inventor of the present invention and so on come to find the proper ranges of a first vertical temperature gradient in the vicinity of the outside wall of the quartz ampule and of a second vertical temperature gradient in a range above the top end of the crucible from the furnace temperature distributions of the three-stage type heating furnaces giving good results.

Subsequently, the inventor of the present invention and so forth grew a single crystal by using a six-stage type heating furnace provided with seven-stages of heaters 31, 32, 33, 34, 35, and 36, as illustrated in FIG. 1(*c*), so as to control the furnace temperature distribution in such a manner that the first and second temperature gradients are within the proper ranges thereof, respectively. Consequently, the inventor of the present invention and so forth achieved a good result that the yield of the single crystal substrates is 21.6 sheets. Further, the yield of the single crystal substrates in the case of using a three-stage heating furnace could be increased to 20 sheets by improving the furnace temperature distribution of the three-stage heating furnace 20 on the basis of the furnace temperature distribution of the seven-stage type heating furnace 30 and by inhibiting the use of furnaces which can not be improved. Thus, the inventor of the present invention and so on confirmed that it was important for increasing the yield of the single crystal substrates to put the first and second temperature gradients within the proper ranges thereof, respectively.

Moreover, the inventor of the present invention and so forth tried to grow a single crystal by increasing the diameter of the crystal, which should be grown, to a large diameter, that is, 4 inches. In this case, the inventor of the present invention and so forth gained the knowledge that the first temperature gradient may have a further smaller value in comparison with the case where the diameter of a crystal is 3 inches. The method of the present invention has come to be completed by the formulation of the values of the first temperature gradient within the proper range thereof on the basis of the knowledge, which is performed by using the diameter of a single crystal as a parameter, and the heat calculation to generalize the values of the second temperature gradient within the proper range thereof.

That is, in accordance with the present invention, there is provided a method for growing a single crystal, which comprises the step of putting a simple substance or a compound consisting of at least one kind of a volatile element, which composes a semiconductor compound, into a reservoir portion of a quartz ampule provided therewith, the step of placing a crucible made of pBN, which contains a raw material of the semiconductor compound, in the quartz ampule and then performing the vacuum sealing of the quartz ampule, the step of thereafter heating the quartz ampule in a heating furnace to thereby melt the raw material, the step of heating the reservoir portion to a predetermined temperature and controlling the vapor pressure by applying the vapor pressure of the volatile element, which has been put into the reservoir portion, to the inside of the quartz ampule, the step of controlling the furnace temperature distribution of the heating furnace in such a manner that the vertical first temperature gradient ($\alpha$ ° C./cm) in the vicinity of the outside wall of the quartz ampule corresponding to the raw melt is smaller than the vertical second temperature gradient ($\beta$ ° C./cm) in a range above the top end of the crucible (in the instant specification, this range indicates a range to a height of 10 cm above the top end of the crucible therefrom) and simultaneously gradually lowering the temperature of the heating furnace so as to grow a single crystal of the compound semiconductor downwardly from the surface of the raw melt in such a manner that the first temperature gradient ($\alpha$ ° C./cm) ranges from $51/D^2$ to $102/D^2$ ° C./cm, more preferably, from $58/D^2$ to $83/D^2$ ° C./cm where D denotes the diameter of the single crystal to be grown and on the other hand, the second temperature gradient ($\beta$ ° C./cm) ranges from 1.06X to 1.72X ° C./cm, more preferably, from 1.19× to 1.46×° C./cm where X is given by the following equation:

$$X = \sqrt{(R\rho/\lambda nL)}$$

in the case where the cooling rate of the furnace temperature and the coefficients of thermal conductivity, the specific gravity, the latent heat of fusion and the formula weight of the crystal are assumed to be R ° C./hr, $\lambda$ kcal/cm·hr·K, $\rho$ g/cm$^3$, L kcal/mol and n g/mol, respectively.

Incidentally, there is a transition region between the first temperature gradient ($\alpha$ ° C./cm) and the second temperature gradient ($\beta$ ° C./cm).

Practically, as the aforementioned heating furnace, for example, a heating furnace which has: at least a first heating means, placed at a position corresponding to the crucible, for controlling the first temperature gradient ($\alpha$ ° C./cm); a second heating means, placed above the first heating means, for controlling the second temperature gradient ($\beta$ ° C./cm); a third heating means, placed under the first heating means, for heating the reservoir portion; a fourth heating means and a fifth heating means, which are placed above the second heating means and under the third heating means and are used for restraining external perturbations from affecting the first temperature gradient ($\alpha$ ° C./cm) and the second temperature gradient ($\beta$ ° C./cm), respectively; and a sixth heating means, placed between the first and third heating means, for restraining the first and third heating means from exerting an influence upon each other, is used. Further, the single crystal of the compound semiconductor is that of, for instance, CdZnTe or CdTe. Preferably, the temperature of the reservoir portion is 770° to 830° C. More preferably, the temperature of the reservoir portion is 790° to 820° C.

Here, the reason why the value of the first temperature gradient ($\alpha$ ° C./cm) is within the aforementioned range is as follows. That is, in the case of the method for growing a single crystal from the surface of the melt, a nucleus generated on the surface of the melt in the process of lowering the furnace temperature grows into a single crystal. If, however, the first temperature gradient ($\alpha$ ° C./cm) is too large, the convection of the melt becomes strong. Thus the nucleus generated on the surface of the melt is destroyed by the convection. Thereby, the generation of a nucleus becomes unstable. In contrast, if too small, the amount of heat supplied to the lower portion of the crucible becomes small. Thus the temperature of the side wall of the crucible can not be held as being higher or equal to the melting point. Further, in the case where the generation of a nucleus becomes unstable or in the case where the temperature of the side wall of the crucible becomes lower than the melting point, the poly-crystallization becomes very easy to occur. This is undesirable for growing a single crystal.

Further, the reason why the value of the second temperature gradient ($\beta$ ° C./cm) is within the aforementioned range is as follows. That is, if the second temperature gradient ($\beta$ ° C./cm) is too small, the amount of absorbed heat becomes smaller than the amount of heat due to the latent heat of fusion. Thus the poly-crystallization occurs. In contrast, if too large, the temperature of the inside wall of the crucible at the level of the surface of the melt becomes equal to or lower than the melting point at an early stage of the growth of a crystal. Thence, the poly-crystallization occurs.

Moreover, the reason why the temperature of the reservoir portion at the time of growing a single crystal of CdZnTe or CdTe is within the aforementioned range is as follows. Namely, according to results of experiments made by the inventor of the present invention and so on, the maximum diameter of deposits in the grown crystal is 10 μm or so if the temperature of the reservoir portion is within the range of 770° to 830° C. Further, the maximum diameter of deposits in the grown crystal is less than 5 μm if the temperature of the reservoir portion is within the range of 790° to 820° C. (see FIG. 4).

In accordance with the method of the present invention for growing a single crystal, a single crystal is grown by controlling the furnace temperature distribution of the heating furnace in such a manner that $\alpha<\beta$. Thus the amount of heat dissipated from the surface of the melt becomes large, so that the growth of a single crystal starts from the surface of the melt downwardly. At that time, the temperature of the inner circumference of the crucible is kept higher than or equal to the melting point of the raw melt during the growth of the single crystal. As a result, the single crystal having grown from the surface of the melt is floated on the melt. Thereby, the single crystal, the growth of which has been advanced, is prevented from coming into contact with the inner wall of the crucible, on which a new nucleus may be generated and a poly-crystallization may occur. Consequently, large-diameter single crystals can be produced with good yields.

Further, a quartz ampule having a reservoir portion is used. Moreover, an operation of controlling a vapor pressure is performed by heating the reservoir portion, which contains a simple substance or a compound comprised of at least one kind of an easily volatilized element (i.e., a volatile element) among composing elements of a compound semiconductor, to a predetermined temperature and further, applying the vapor pressure of the volatile element to the reservoir portion. Thus, in comparison with the case where a predetermined quantity of a volatile element is simply put into a quartz ampule having no reservoir portion, the variation in the applied vapor pressure is constrained. Moreover, the decomposition of a surface portion of the grown single crystal, as well as the vaporization of the raw melt, is effectively restrained. Thereby, lineage is reduced. Furthermore, the generation of a large deposit can be prevented. Consequently, a good-quality single crystal can be obtained.

Moreover, the crucible made of pBN, the vacuum sealing of which is performed in the quartz ampule, is used as a grower container. The side wall of the crucible made of pBN has anisotropy in coefficient of thermal conductivity, namely, the coefficient of thermal conductivity in the vertical direction thereof is high, while the coefficient of thermal conductivity in the horizontal direction thereof is low. Thus the heat applied to a lower portion of the crucible is easily transmitted to the upper portion of a side wall of the crucible. Furthermore, the amount of heat radiated in the horizontal direction can be limited to a small amount. This is extremely effective in keeping the temperature of the inner wall of the crucible higher than or equal to the melting point during the growth of single a crystal. Incidentally, needless to say, the crucible made of pBN has an advantage in preventing impurities from being contaminated. Moreover, a draft (i.e., a taper) for extracting a crystal, whose growth is finished, is provided in the crucible. That is, attention has been paid to the facilitation of extraction of a crystal.

Furthermore, if the diameter of a single crystal to be grown is assumed to be D cm, the first temperature gradient ($\alpha$ ° C./cm) in the vertical direction in the vicinity of the outside wall of the quartz ampule, which corresponds to the raw melt, ranges from $51/D^2$ to $102/D^2$ ° C./cm. Thus the first temperature gradient ($\alpha$ ° C./cm) is not too large. The convection of the melt becomes not so strong that the nucleus generated in the surface portion of the melt disappears. Consequently, the generation of the nucleus is stabilized. On the other hand, the first temperature gradient ($\alpha$ ° C./cm) is not too small. Further, an appropriate amount of heat is kept supplied to the lower part of the crucible. Thus the side wall of the crucible is kept at temperatures equal to or higher than the melting point during the growth of a single crystal. Consequently, large-diameter single crystals can be produced with a good yield.

Especially, the controllability of the first temperature gradient ($\alpha$ ° C./cm) and the second temperature gradient ($\beta$ ° C./cm) is extremely improved by using the aforementioned multi-stage type furnace having at least the first to sixth heating means as the heating furnace. Consequently, the yields of the single crystals are dramatically increased.

Further, when growing a single crystal of CdZnTe or CdTe, the diameters of deposits in the grown crystal are small and 10 μm or so at the maximum if the temperature of the reservoir portion is within the range of 770° to 830° C. Furthermore, the diameters of deposits in the grown crystal are extremely small and the maximum diameter thereof is less than 5 μm if the temperature of the reservoir portion is within the range of 790° to 820° C. Consequently, an extremely excellent quality single crystal can be obtained.

BEST MODE FOR CARRYING OUT THE INVENTION

In the case of a method of the present invention for growing a single crystal, while a vapor pressure controlling operation is performed by heating a reservoir portion of a quartz ampule to a predetermined temperature and keeping the reservoir portion at the predetermined temperature, the furnace temperature distribution of a heating furnace is controlled in such a manner that the vertical first temperature gradient (α ° C./cm) in the vicinity of the outside wall of the quartz ampule corresponding to the raw melt is smaller than the vertical second temperature gradient (α ° C./cm) in a range above the top end of the crucible. Thus a single crystal of the compound semiconductor is grown downwardly from the surface of a raw melt. Furthermore, the proper ranges of the first temperature gradient (α ° C./cm) and the second temperature gradient (β ° C./cm) are prescribed, respectively. First, the details of the prescribing of the proper range of each of the first and second temperature gradients will be described hereinbelow. Thus it is based on this that the present invention is completed on the basis of objective facts and that the present invention is not subjected to restrictions due to the diameter and composition of a single crystal to be grown and is, therefore, of universal application.

Figure 1A:
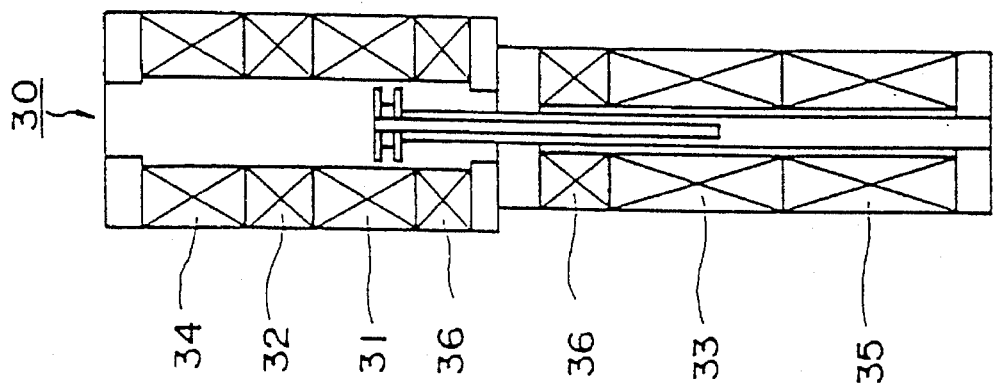
FIGS. 1(a), (b) and (c) are schematic sectional views for schematically illustrating the heating furnaces of three types used in VGF method.
Figure 1B:
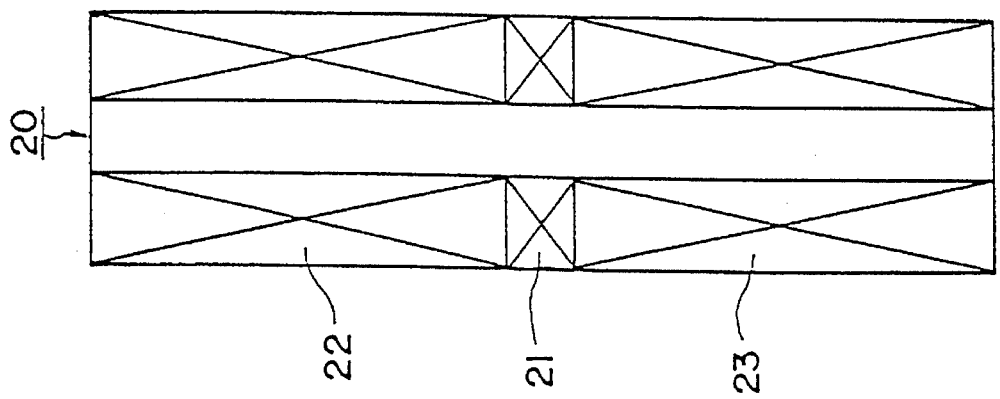

First, the inventor of the present invention and so on conducted an experiment (i.e., Experiment 1) on the growth of an 80 mm (3-inch) diameter single crystal of CdZnTe by using a plurality of heating furnaces, the configuration of each of which was similar to that of the three-stage type heating furnace 20 as illustrated in FIG. 1(b). Thereafter, the inventor of the present invention and so on made a comparison between the furnace temperature distribution characteristics of a furnace having a good yield of single crystal substrates and another furnace having a poor yield thereof. Further, as the result of investigating the furnace temperature distribution regarding each of the cases where the grown crystal was a single crystal and where the grown crystal was poly-crystalline, it was revealed that when a single crystal was obtained, the value of the first temperature gradient (α ° C./cm) ranged from 0.8 to 1.6° C./cm, more preferably, ranged from 0.9 to 1.3° C./cm and on the other hand, the value of the second temperature gradient (β ° C./cm) ranged from 1.6 to 2.6° C./cm, more preferably, ranged 1.8 to 2.2° C./cm.

Figure 2:
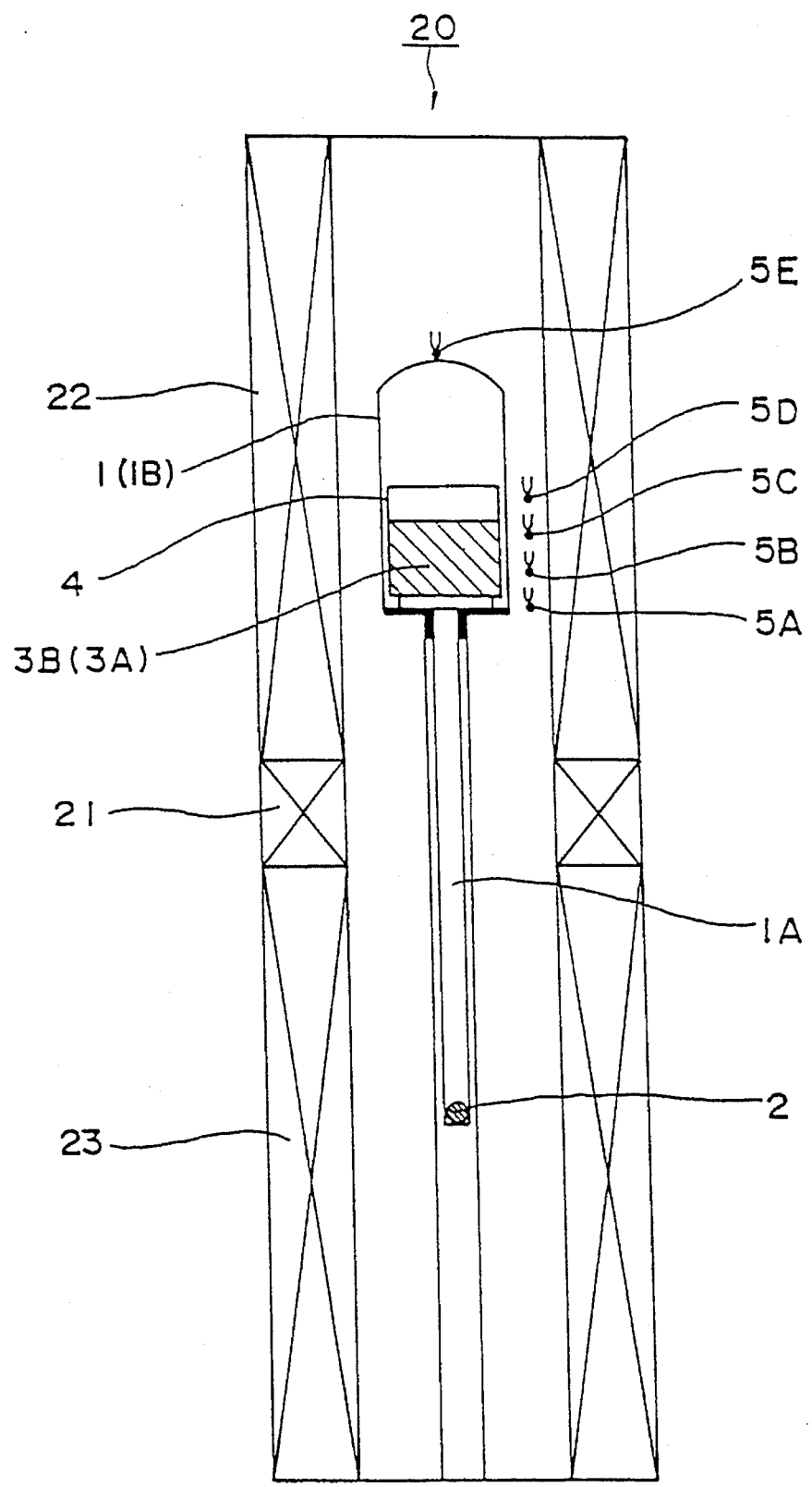
FIG. 2 is a schematic sectional view for illustrating a three-stage type heating furnace used in this embodiment.

In the case of this Experiment 1, as illustrated in FIG. 2, the quartz ampule 1 having the reservoir portion 1A was used. Further, the simple substance of a volatile element Cd2 was put into the reservoir portion 1A. Moreover, the crucible 4 made of pBN, into which CdZnTe material 3A was put, was placed in the quartz ampule 1. Thereafter, the vacuum sealing of the quartz ampule 1 was performed. Further, the raw material 3A contained in the crucible 4 was melted by heating the crucible 4 by use of the heater 22. Moreover, the vapor pressure was controlled by heating the reservoir portion 1A to a predetermined temperature in the range of, for example, 770° to 830° C. by means of the heater 23. The lower part of the crucible 4 was heated by using the heater 21. The temperature in the heating furnace 20 was gradually lowered by controlling electric power to be supplied to the heaters 21, 22 and 23 by use of a control unit (not shown) in such a manner that the desired temperature distribution occurred in the heating furnace 20.

Further, thermocouples 5A, 5B, 5C, 5D and 5E were provided in the vicinity of the outside wall of the quartz ampule 1. The temperature in the vicinity of the outside wall of the quartz ampule 1 was measured. Moreover, the positions of the thermocouples 5A, 5B, 5C, 5D and 5E corresponded to the bottom of the quartz ampule 1, a position which was at an altitude of 30 mm above the bottom thereof, a position which was at an altitude of 60 mm above the bottom thereof, a position which was at an altitude of 90 mm above the bottom thereof, and the cap 1B of the quartz ampule 1 (that is, a position which was at an altitude of 220 mm above the bottom thereof), respectively. The values of the first temperature gradient (α ° C./cm) and the second temperature gradient (β ° C./cm) were found on the basis of temperature measurement values of these five thermocouples 5A, 5B, 5C, 5D and 5E.

Figure 1C:
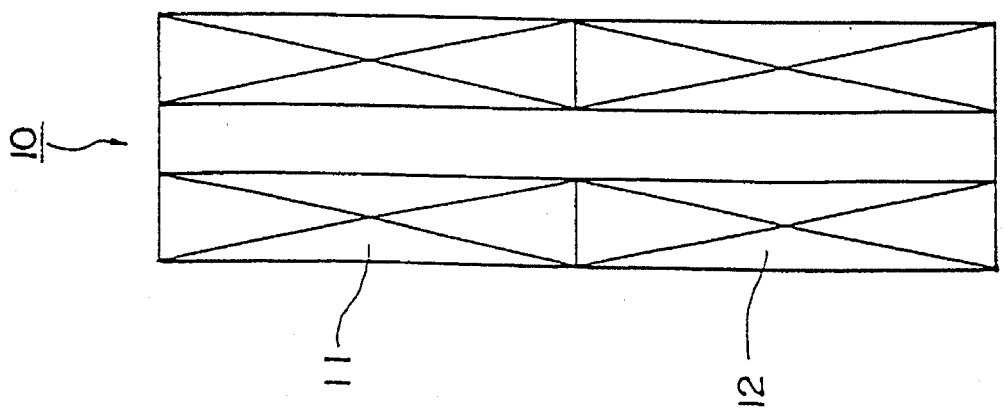

Meanwhile, the inventor of the present invention produced the six-stage type heating furnace 30 having six stages of heaters 31, 32, 33, 34, 35, and 36 as illustrated in FIG. 1(c) by way of trial. Further, the furnace temperature distribution in the six-stage type heating furnace 30 was investigated by using a plurality of thermocouples similarly as in the case of the three-stage type heating furnace 20 when growing a single crystal (Experiment 2). The temperature gradient between the bottom of the crucible and the initial position of the surface of the raw melt, that is, the first temperature gradient (α ° C./cm) was almost constant from the initiation of the growth to the termination thereof. Furthermore, it turned out that the precision of controlling the temperature was improved in comparison with the three-stage type heating furnace 20.

In FIG. 1(c), the heater 31 is a first heating means which is placed at a position corresponding to the crucible and is operative to control the first temperature gradient. The heater 32 is a second heating means which is operative to heat the space above the top end of the crucible and to control the second temperature gradient. The heater 33 is a third heating means for heating the reservoir portion 1A. The heaters 34 and 35 are fourth and fifth heating means for restraining external perturbations from affecting the furnace temperature distribution. The heaters 36 in sixth heating means for restraining the aforementioned heaters 31 and 33 from exerting an influence upon each other. Incidentally, the sixth heating means may be constituted only by one heater. The number of stages of heaters is not limited to six. The furnace may have seven or more stages of heaters.

Subsequently, the inventor of the present invention and so on tried to grow a four-inch diameter single crystal of CdZnTe, similarly as in the case of Experiment 1, by using the aforementioned six-stage type heating furnace 30 (Experiment 3). As a result, a single crystal was obtained on condition that the first temperature gradient (α ° C./cm) was 0.53° C./cm and the second temperature gradient (α ° C./cm) was 1.83° C./cm. This revealed that the proper value of the first temperature gradient (α ° C./cm) became small when the diameter of a crystal to be grown became large. The inventor of the present invention and so on obtained the knowledge that the first temperature gradient (α ° C./cm) should be in inverse proportion to the section of the crystal (that is, the square of the diameter thereof). In the case of this experiment, the vapor pressure was controlled by heating the reservoir portion 1A to the predetermined temperature in the range of, for example, 770° to 830° C.

As the result of considering the permissible range of variation of temperature due to various causes on the basis of the aforementioned knowledge, it was found that the appropriate range of the first temperature gradient (α ° C./cm) was $51/D^2$ to $102/D^2$ ° C./cm, more preferably, from $58/D^2$ to $83/D^2$ ° C./cm where D designates the diameter of a single crystal to be grown.

Figure 3:
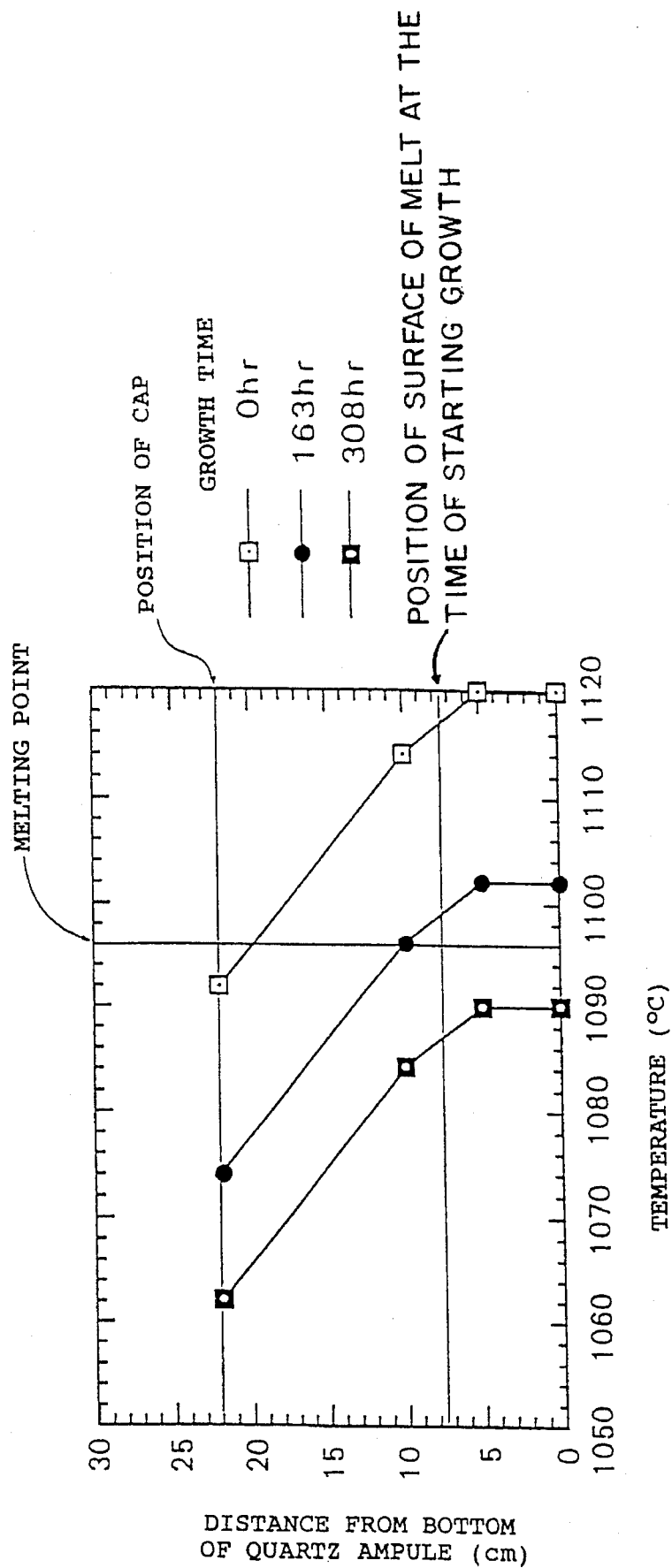
FIG. 3 is a temperature-position characteristic diagram for showing the furnace temperature distribution in a raw melt and a region above the raw melt of this embodiment.

Incidentally, FIG. 3 is a temperature-position characteristic diagram for showing an example of the furnace temperature distribution when a four-inch diameter single crystal was obtained. Additionally, in FIG. 3, each plot indicates a temperature measured by the thermocouple.

Next, the inventor of the present invention and so forth made the following calculation by establishing a precondition so as to estimate a temperature gradient on a solid-liquid interface, which was obtained from the temperatures in a single crystal, a raw material and the inner wall of the crucible but could not be measured during the growth of a crystal. The precondition was that an amount Q1 of heat transmitted in a single crystal grown and solidified was equal to the latent heat Q2 of fusion of the raw melt (i.e., Q1=Q2). When making the calculation, the following numerical values and symbols were used.

The cooling rate of the furnace temperature: 0.1K/hr.

The diameter of the single crystal: 100 mm (4 inches).

The coefficient of thermal conductivity of CdTe (incidentally, a value thereof in the proximity of the melting point): 1.5 W/m·K=1.29 kcal/m·hr·K The specific gravity of CdTe: 5.86 g/mol.

The latent heat of fusion of CdTe: 12 kcal/mol.

The temperature gradient on the solid-liquid interface: X k/cm.

Thus, the amount Q1 of heat transmitted in a single crystal grown and solidified was given by the following equation:

$$Q1 = \pi \times 5^2 \text{ (cm}^2) \times X \text{ (k/cm)} \times 1.29 \text{ (kcal/m} \cdot \text{hr} \cdot \text{K)}$$
$$= 1.013X \text{ (kcal/hr)}$$

Further, the latent heat Q2 of fusion of the raw melt was obtained by the following equation:

$$Q2 = 0.1 \text{ (k/hr)} \div X \text{ (K/cm)} \times \pi \times 5^2 \text{ (cm}^2) \times$$
$$5.86 \text{ (g/cm}^3) \div 240 \text{ (g/mol)} \times 12 \text{ (kcal/mol)}$$
$$= 2.301/X \text{ (kcal/hr)}.$$

Furthermore, Q1=Q2. Therefore, $$1.013 X = 2.301/X$$

Finally, the value of X is obtained as follows by solving this equation:

$$X=1.51 \text{ K/cm}.$$

That is, the temperature gradient on the solid-liquid interface is estimated as 1.51 K/cm.

It was seen from the foregoing description that even if the temperature gradient ($\alpha$ ° C./cm) measured in the neighborhood of the outside wall of the quartz ampule was less than 1.0 K/cm similarly as in the case of the growth of, for instance, the aforementioned four-inch diameter single crystal of CdZnTe, the practical temperature gradient in the practical single crystal and on the solid-liquid interface was more than such a value and was a little smaller than the temperature gradient (1.83 K/cm) in the space above the top end of the crucible. Therefore, as will be described later, the generalization of the second temperature gradient ($\beta$ ° C./cm) could be achieved on the basis of the precondition that the amount Q1 of heat transmitted in a single crystal grown and solidified was equal to the latent heat Q2 of fusion of the raw melt.

Further, the actual temperature gradient in the single crystal and the solid-liquid interface was 1.51 K/cm. Thus the growing rate of the single crystal was estimated as 0.66 mm/hr.

$$0.1 \text{ (K/hr)} \div 1.51 \text{ (K/cm)} = 0.66 \text{ (mm/hr)}$$

Consequently, the substantial growth time of a 60 mm length single crystal was obtained as 91 hours from the following expression for computation:

$$60 \text{ (mm)} \div 0.66 \text{ (mm/hr)} = 91 \text{ (hr)}.$$

Further, usually, the temperature at a position on the outside wall of the quartz ampule, which corresponds to the surface of the raw melt at the time of starting the growth, is 1117° C. The growth of a single crystal is completely finished at the time when the temperature of the crystal ampule reaches the melting point (1098° C.) of the raw melt after cooling the outside wall from such a temperature of the outside wall at a cooling rate of 0.1 K/hr. Here, if the difference between the temperatures of the crucible inner safe and the outside wall of the quartz ample was estimated as 5K (which was a value obtained by a preliminary experiment conducted by putting the thermocouples into the raw liquid), the growth of the single crystal came to be already completed when the temperature of the outside wall of the quartz ampule was 1103° C. Thus, because the substantial growth time was 91 hours among 140 hours during which the temperature changed from 1117° C. to 1103° C., a growing nucleus occurs in the surface portion of the raw melt when the temperature of the quartz ampule when the temperature of the quartz ampule became equal to 1112° C. after the lapse of a time of 49 hours posterior to the starting of the growth. Thereby, it was found that a single crystal was obtained by accurately controlling the furnace temperature distribution until tens or hundreds hours were lapsed after the growth was started.

Next, the inventor of the present invention and so on performed the generalization of the second temperature gradient ($\beta$ ° C./cm) on the basis of the results of the heat calculation conducted in the aforementioned practical example in order to realize the application of the present invention to the growth of a single crystal of other compound semiconductors such as InP, GaAs, ZnSe and ZnTe. A precondition at that time was the same as the precondition that the amount Q1 of heat transmitted in a single crystal grown and solidified was equal to the latent heat Q2 of fusion of the raw melt (i.e., Q1=Q2). Incidentally, the numerical values, such as the cooling rate of the furnace temperature, used for the calculation of the precondition were symbolized as follows:

The cooling rate of the furnace temperature (K/hr): R.

The section of a single crystal (cm$^2$): S.

The coefficient of thermal conductivity of the crystal (kcal/cm·hr·K): $\lambda$.

The specific gravity of the crystal (g/cm$^3$): $\rho$.

The latent heat of fusion of the crystal (kcal/mol): L.

The temperature gradient on the solid-liquid interface (K/cm): X.

The formula weight of the crystal (g/mol): n.

Thus the amount Q1 of heat transmitted in a single crystal grown and solidified was given by the following equation:

$$Q1 = S \times X \times \lambda$$

Moreover, the latent heat Q2 of fusion of the raw melt was obtained by the following equation:

$$Q2 = R \div X \times S \times \rho \div n \times L$$

Since Q1=Q2, $$S \times X \times X \lambda = R \div X \times S \times \rho \div n \times L$$

Therefore, by solving this equation for X, the following equation was obtained:

$$X = \sqrt{(R\rho/\lambda nL)} \quad .$$

As the result of considering the permissible range of variation of temperature due to various causes on the basis of this, it was found that the appropriate range of the second temperature gradient (β ° C./cm) was 1.06X to 1.72X ° C./cm, more preferably, 1.19× to 1.46×° C./cm.

Then, the inventor of the present invention and so on made single crystals of CdZnTe grow a plurality of times (Experiment 4), similarly as in the case of Experiment 1, by setting the first temperature gradient (α ° C./cm) and the second temperature gradient (β ° C./cm) as values selected from those of the generalized proper range in order to verify the validity of the generalization of the first temperature gradient (α ° C./cm) and the second temperature gradient (β ° C./cm), which was performed in the aforementioned manner. The surface orientation of the obtained single crystal is always the orientation corresponding to a crystal plane (111), which is a preferential growing orientation. Further, an etch-pit density (EPD) was measured by etching a substrate cut out of the single crystal by use of HF etchant. The measured value of EPD ranged from $4 \times 10^4$ to $6 \times 10^4$ $cm^{-2}$. This value corresponds to a dislocation density (see K. Nakagawa et al., Appl. Phys. Lett., 34 (1979) 574). Moreover, the half-value width of rays diffracted by a crystal plane (333), which was measured by performing four-crystal X-ray diffraction measurement, was equal to or less than 20 seconds (i.e., 7 to 20 seconds). It was found from the results of the measurement that the crystallinity of the obtained single crystal of CdZnTe was good. Thus the validity of the present invention was confirmed.

Figure 4:
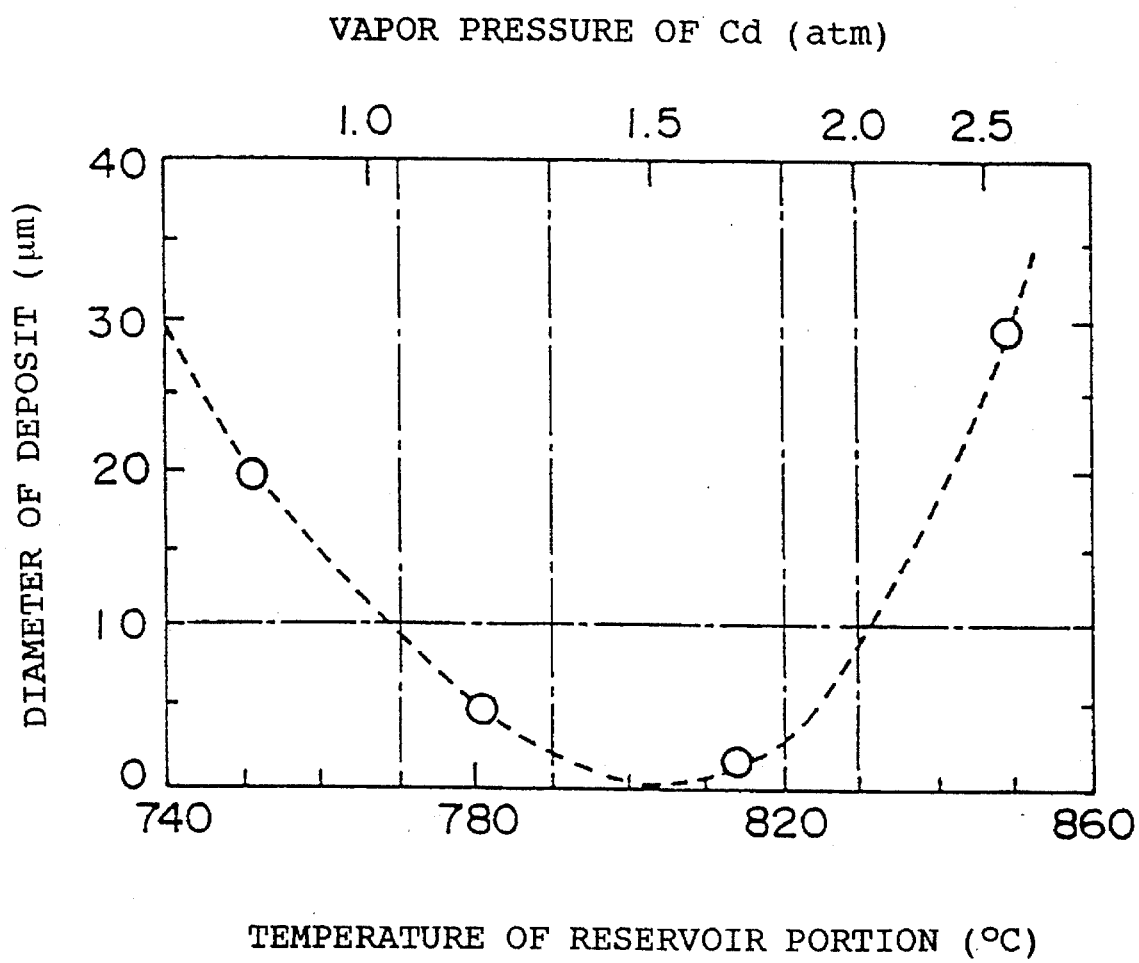
FIG. 4 is a characteristic diagram for illustrating the correlation between the temperature of the reservoir portion of this embodiment and the diameter of a deposit.

Subsequently, the inventor of the present invention and so on made an experiment (i.e., Experiment 5) so as to prescribe the most appropriate range of the temperature of the reservoir portion 1A serving as a factor in determining the vapor pressure of the volatile element, which was an object of the vapor pressure controlling operation. The results of this experiment are illustrated in FIG. 4. As is inferred from this figure, if the temperature of the reservoir portion 1A was 770° to 830° C., that is, the vapor pressure of Cd was nearly 1.0 to 2.0 atm, the deposit in the grown crystal was small and was 10 μm or so in diameter at the maximum. Further, if the temperature of the reservoir portion 1A was 790° to 820° C., that is, the vapor pressure of Cd was nearly 1.3 to 1.8 atm, the deposit in the grown crystal was extremely small and was 5 μm or so in diameter at the maximum. Thus, it was found that the temperature of the reservoir portion 1A was preferably 770° to 830° C., and was more preferably 790° to 820° C. Incidentally, when the temperature of the reservoir portion 1A was almost 813° C. (815° to 825° C. or so) and the vapor pressure of Cd was 1.7 atm, n-type and p-type inversion or conductive regions occurred in the crystal. Further, the deposits were smallest in size.

In the case of Experiment 5, the reservoir portion 1A was heated to 750°, 780° C., almost 813° and 850° C. Further, in the case of each of these temperatures, a single crystal of CdTe was made to grow, similarly as in the case of Experiment 1. Furthermore, the sizes of the deposits in the obtained crystal were measured by using an infrared microscope.

Thus, in accordance with the present invention, not only in the case of using the aforementioned seven-stage type heating furnace as the heating furnace, but also in the case of using the aforementioned three-stage type heating furnace, better-quality and large-diameter single crystals can be produced with a good yield.

Incidentally, the present invention is not subjected to restrictions due to the aforementioned embodiment thereof. For example, the present invention may be applied to the growth of single crystals of other compound semiconductors such as InP, GaAs, ZnSe and ZnTe other than CdTe and CdZnTe. Further, the diameter of the single crystal to be grown is not limited to 3 inches and 4 inches. Moreover, the number of stages of heaters of a heating furnace used at that time is not limited to three and seven.

Furthermore, instead of performing the growth of single crystals by measuring the temperature in the vicinity of the outside wall of the quartz ampule 1 at all times by means of the thermocouples 5A, 5B, 5C, 5D and 5E provided therein similarly as in the case of the aforementioned embodiment, a single crystal may be grown by controlling the first temperature gradient (α ° C./cm) and the second temperature gradient (β ° C./cm) while measuring temperature at a point for measuring temperature, which is provided at a place other than the vicinity of the outside wall of the quartz ampule 1, by utilizing the relation between the temperatures at the newly provided temperature measuring point and the vicinity of the outside wall of the quartz ampule 1, which has been preliminarily obtained by performing a preliminary experiment.

In accordance with the method of the present invention for growing a single crystal, the vertical second temperature gradient (β ° C./cm) in a range above the top end of the crucible is larger than the vertical first temperature gradient (α ° C./cm) in the vicinity of the outside wall of the quartz ampule corresponding to the raw melt. Thus, the single crystal having grown from the surface of the melt is floated on the melt in such a manner as not to come into contact with the inner wall of the crucible. Thereby, a new nucleus can be prevented from being generated on the inner wall of the crucible. Consequently, it becomes easy to obtain single crystals.

Further, an operation of controlling a vapor pressure is performed by heating the reservoir portion, which contains an easily volatilized element. Thus, the variation in the vapor pressure is constrained. Further, the vapor pressure can be kept at an appropriate level. Moreover, the decomposition of a surface portion of the grown single crystal, as well as the vaporization of the raw melt, is more effectively restrained. Thereby, lineage is reduced. Furthermore, the generation of a large deposit can be prevented. Consequently, the quality of a single crystal can be improved.

Moreover, the crucible made of pBN has anisotropy in coefficient of thermal conductivity. Thus the heat applied to a lower portion of the crucible is easily transmitted to the upper portion of a side wall of the crucible. Furthermore, the amount of heat radiated in the horizontal direction can be limited to a small amount. This is extremely effective in keeping the temperature of the inner wall of the crucible higher than or equal to the melting point during the growth of single a crystal.

Furthermore, if the first temperature gradient (α ° C./cm) in the vertical direction in the vicinity of the outside wall of the quartz ampule, which corresponds to the raw melt, ranges from $51/D^2$ to $102/D^2$ ° C./cm, more preferably, from $58/D^2$ to $83/D^2$ ° C./cm, the loss of the nucleus due to the convection of the melt can be prevented. Consequently, the generation of the nucleus is stabilized. Moreover, an appropriate amount of heat is kept supplied to the lower part of the crucible. Thus the side wall of the crucible is kept at temperatures equal to or higher than the melting point during the growth of a single crystal. Consequently, it becomes easy to obtain single crystals.

Especially, the controllability of the first temperature gradient (α ° C./cm) and the second temperature gradient (β ° C./cm) is extremely improved by using the multistage type furnace having at least a first heating means for controlling the first temperature gradient (α ° C./cm), a second heating means for controlling the second temperature gradient (β ° C./cm), a third heating means for heating the reservoir portion, a fourth heating means and a fifth heating means used for restraining from being affected by external perturbations and a sixth heating means for restraining the first and third heating means from exerting an influence upon each other. Consequently, the yields of the single crystals are dramatically increased.

Further, when growing a single crystal of CdZnTe or CdTe, the diameters of deposits in the grown crystal are small and 10 µm or so at the maximum if the temperature of the reservoir portion is within the range of 770° to 830° C. Furthermore, the diameters of deposits in the grown crystal are extremely small and the maximum diameter thereof is less than 5 µm if the temperature of the reservoir portion is within the range of 790° to 820° C. Consequently, an extremely excellent quality single crystal can be obtained.

As stated above, the present invention has an advantage in that a further-excellent-quality and large-diameter single crystal can be produced with a good yield thereof.

Industrial Applicability

As described above, the present invention is most effective for producing a single crystal of a compound semiconductor, especially, for producing a single crystal of a compound semiconductor in accordance with VGF method by controlling a vapor pressure.

We claim:

1. A method for growing a single crystal, comprising the steps of:

putting a semiconductor compound having at least one volatile element into a reservoir portion of a quartz ampule provided therewith;

placing a crucible made of pBN, which contains a raw material of the semiconductor compound, in the quartz ampule and vacuum sealing the quartz ampule;

heating the quartz ampule in a heating furnace to thereby melt the raw material;

heating the reservoir portion to a predetermined temperature to vaporize the volatile element of the semiconductor compound in the reservoir portion thereby creating a vapor pressure and controlling the vapor pressure by applying the vapor pressure of the volatile element in the reservoir portion, to the inside of the quartz ampule;

controlling a temperature distribution of the heating furnace such that a vertical first temperature gradient in a vicinity of the outside wall of the quartz ampule corresponding to the raw material is smaller than a vertical second temperature gradient in a vicinity above the top end of the crucible, and simultaneously gradually lowering the temperature of the heating furnace so as to grow a single crystal of the semiconductor compound downwardly from the surface of the raw material such that the first temperature gradient ranges from $51/D^2$ to $102/D^2$ °C./cm, where D denotes the diameter of the single crystal to be grown, and the second temperature gradient ranges from $1.06X$ to $1.72X$ °C./cm, where X is given by the following equation:

$$X = \sqrt{(R\rho/\lambda nL)}$$

wherein R represents a cooling rate of the furnace temperature, $\lambda$ represents a coefficient of thermal conductivity, $\rho$ represents a specific gravity, L represents a latent heat of fusion and n represents a formula weight of the crystal.

2. The method for growing a single crystal according to claim 1, wherein said heating furnace has: at least a first heating means, placed at a position corresponding to the crucible, for controlling the first temperature gradient; a second heating means, placed above the first heating means, for controlling the second temperature gradient; a third heating means, placed under the first heating means, for heating the reservoir portion; a fourth heating means and a fifth heating means, which are placed above the second heating means and under the third heating means and are used for restraining external perturbations from affecting the first temperature gradient and the second temperature gradient, respectively; and a sixth heating means, placed between the first and third heating means, for restraining the first and third heating means from exerting an influence upon each other.

3. The method for growing a single crystal according to claim 1, wherein the single crystal of the compound semiconductor is a single crystal of CdZnTe or CdTe.

4. The method for growing a single crystal according to claim 3, wherein the temperature of the reservoir portion is within the range of 770° to 830° C.

5. The method for growing a single crystal according to claim 2, wherein the single crystal of the compound semiconductor is a single crystal of CdZnTe or CdTe.

6. The method for growing a single crystal according to claim 5, wherein the temperature of the reservoir portion is preferably within the range of 770°0 to 830° C.

* * * * *